United States Patent [19]

Veneklasen et al.

[11] Patent Number: 5,847,959
[45] Date of Patent: Dec. 8, 1998

[54] METHOD AND APPARATUS FOR RUN-TIME CORRECTION OF PROXIMITY EFFECTS IN PATTERN GENERATION

[75] Inventors: Lee H. Veneklasen, Castro Valley; Robert Innes, Berkeley; Sergey Babin, Castro Valley; David Trost, San Francisco; Jeffrey Varner, Pacifica, all of Calif.

[73] Assignee: Etec Systems, Inc., Hayward, Calif.

[21] Appl. No.: 789,246

[22] Filed: Jan. 28, 1997

[51] Int. Cl.$^6$ .............................. G06F 11/00; G03C 5/00
[52] U.S. Cl. ............................. 364/468.28; 250/492.2; 250/492.22; 430/313; 430/296; 430/942
[58] Field of Search ................. 364/468.26, 468.27, 364/468.28; 250/492.2, 492.22; 430/26, 311, 312, 313, 296, 298, 942

[56] References Cited

U.S. PATENT DOCUMENTS

| | | | |
|---|---|---|---|
| 3,900,737 | 8/1975 | Collier et al. | 250/492 A |
| 4,153,843 | 5/1979 | Pease | 250/492 A |
| 4,243,866 | 1/1981 | Pfeiffer et al. | 219/121 EK |
| 4,463,265 | 7/1984 | Owen et al. | 250/492.2 |
| 4,812,962 | 3/1989 | Witt | 364/490 |
| 4,988,284 | 1/1991 | Liu et al. | 430/296 |
| 5,051,598 | 9/1991 | Ashton et al. | 250/492.2 |
| 5,294,800 | 3/1994 | Chung et al. | 250/492.22 |
| 5,304,441 | 4/1994 | Samuels et al. | 430/30 |
| 5,393,987 | 2/1995 | Abboud et al. | 250/492.22 |
| 5,451,487 | 9/1995 | Abe et al. | 430/296 |
| 5,563,419 | 10/1996 | Tamura | 250/492.22 |
| 5,657,235 | 8/1997 | Liebmann et al. | 364/474.24 |
| 5,736,281 | 4/1998 | Watson | 430/30 |

FOREIGN PATENT DOCUMENTS 196 25 894  1/1997  Germany.

OTHER PUBLICATIONS

S.V. Babin, et al., "Model and measurement of resist heating effect in EBL, " SPIE vol. 1671, (1992) pp. 93–97.

Fumio Murai, et al., "Fast proximity effect correction method using a pattern area density map, " J. Vac. Sci. Technol B, vol. 10, No. 6, Nov/Dec 1992, pp. 3072–3076.

P.F. Petric, et al., "Design aspects of the optics of the VLS–1000 electron–beam direct–write lithography system," J. Vac. Sci. Technol B, Vol. 1, No. 4, Oct.–Dec. 1983, pp. 995–998.

*Primary Examiner*—Paul P. Gordon
*Attorney, Agent, or Firm*—Skjerven, Morrill, MacPherson, Franklin & Friel; Norman R. Klivans; Bernard Berman

[57] ABSTRACT

An electron beam pattern generating system for exposing a pattern on a substrate using a raster scan method. The system stores a rasterized representation of the pattern as a plurality of regular pixel dose exposure levels. These pixel dose exposure levels are evaluated by the system for one or more proximity effects and corrections to the dose exposure level and/or pixel location are calculated. The system includes apparatus for both calculation and storage of intermediate and final results as required. As they are calculated, the corrections are provided to an exposure dose modulator wherein they are applied to forming the pattern. Thus corrections for both long range and short range proximity effects due to both electron scattering and heating as well as for proximity effects due to global thermal expansion can be calculated and provided during run-time and a corrected pattern exposed.

20 Claims, 8 Drawing Sheets

METHOD AND APPARATUS FOR RUN-TIME CORRECTION OF PROXIMITY EFFECTS IN PATTERN GENERATION

BACKGROUND

1. Field of Invention

This invention pertains generally to pattern generation systems and methods used by such systems to form patterns on substrates, and particularly pertains to an electron beam pattern generation system, e.g. of the type used in the semiconductor industry, employing a raster scan writing strategy and operation of such a system where the pattern generated is corrected during run-time.

2. Description of the Prior Art

Any effect on the exposure of a point in an imaged pattern, by the exposure of any neighboring point can be called a proximity effect. For example, limited resolution of the electron optical exposure or inherent resist resolution, electron scattering in the resist layer and electron backscattering from the substrate on which the resist layer lies all cause a blurring of the exposure dose distribution delivered to a specific point. Thus a portion of the exposure dose designed to be delivered to a specific point is in fact delivered to neighboring points.

In addition, exposure of the resist layer at a specific point results in localized heating of the resist that can diffuse outward to neighboring points. The result is modified resist sensitivity at those neighboring, proximate points.

Thermal expansion of the substrate on which the resist is formed is another localized heating effect that can result in feature placement errors at neighboring points through non-uniform thermal expansion of the substrate.

These proximity effects all result in an exposure dose error, real or effective, at specific points. Scattering effects and thermal expansion cause real exposure dose errors by altering the location of the point where an electron influences the resist. Resist heating results in an effective exposure dose error by altering the sensitivity of the resist to electrons.

Where scattering effects depend only on the total exposure dose delivered to neighboring sites, thermal expansion and resist heating effects are also influenced by the rate and time sequence of exposure dose delivery. Thus, by a variety of mechanisms, proximity effects result in unwanted variations in the size, shape and or location of lithographic features.

The correction of these errors is an important aspect of electron beam lithography, heightened by the trend to smaller geometries with increasingly complex patterns requiring greater precision and accuracy. While several partial solutions have been attempted and or proposed, none provides correction for all of the aforementioned effects and none provides for both calculating and executing the corrections during the exposure "run-time".

One such partial solution is the subject of U.S. Pat. No. 5,294,800 issued Mar. 15, 1994 to Chung et al. directed to calculating corrections for electron scattering effects. "An integrated circuit chip design . . . is divided into parcels (called parceling) that each contain about the same number of shape vertices. . . . shapes are proximity corrected for both forward and backward scattering. . . . This process is repeated on each parcel until the last parcel is processed." In addition to only correcting for electron scattering effects, the improved calculation methods are used during the image postprocessing stage and thus are not performed during exposure run-time.

Another partial solution is the subject of U.S. Pat. No. 5,051,598 issued Sep. 24, 1991 to Ashton et al. Like Chung et al., Ashton et al. is directed to corrections for electron scattering effects only and are performed during postprocessing of the data. Ashton et al. provide for "A proximity effect correction method for electron beam lithography suitable for high voltage and/or very dense patterns applies both backscatter and forward scatter corrections."

Another method proposed by M. Parikh, J. Appl. Phys., 50 (6), June 1979 4371, 4378 and 4383, "Corrections to proximity effects in electron beam lithography. (I. Theory) (II. Implementation) (III. Experiments)" divides the pattern into smaller pieces and modifies the exposure of each piece to assure uniform resist dose, however this method does not account for all proximity effects and is not compatible with run-time calculations.

Still another method, proposed by Otto et al., "Proximity Correction on the ABELE-150", J. Vac. Sci. Technol. B Vol. 6 (1) January/February 1988, p. 443, describes a method for correcting scattering proximity effects by controlling the exposure dose of feature edges separately from the remainder of the pattern area. However, as with Parikh this does not account for all proximity effects and is not compatible with run-time calculations.

These and numerous other methods calculate corrections using data in a vector data format. As data in a vector format is not necessarily organized so that near neighbors are easily found, the calculations required to determine corrections are very complex. In addition, vector data rarely contains specific information about exposure sequence and timing, that is required to make heating corrections.

When corrections are calculated from a vector data base, the data must first be spatially and temporally sorted before corrections may be calculated. As the data base defines discrete features, the calculation must break up such pattern features into more smaller components and then assign a correction dose to each component. As scattering ranges increase and features become smaller, the calculation of each feature's correction dose must consider contributions from a very large number of neighboring features, requiring many sorting and geometric operations for each feature in the data file. Thus pre-processing for proximity correction is slow and it is not realistic to proximity correct a vector data representation during exposure or run-time.

An electron beam lithography system using an alternate data representation for exposure is the subject of U.S. Pat. No. 3,900,737 issued Aug. 19, 1975 to Collier et al. The disclosed exposure system exposes patterns using periodic raster scans much like a television. Such systems convert a vector data representation into a "rasterized" or "pixelized" data format representing the pattern to be exposed on a predetermined, fine grained grid where the exposure of each constituent pixel is specified. Storage of an entire pattern data base in raster scan format requires too much memory to be practical, therefore these systems start with the more compact vector data format and generate the rasterized data at run time during exposure.

The raster format generated from the vector data is broken up into pixels which are spatially and temporally sorted, thus simplifying and speeding up the computation of proximity corrections. Resist heating corrections exploit a rasterized format because they demand a regular relationship between the position and time of pixel exposure. However, since rasterized data is only available during exposure, calculations for proximity effect corrections from rasterized data must be done during run-time.

One prior art method, the "Ghost" method, is essentially an example of a run-time correction technique. (See, U.S. Pat. No. 4,463,265 issued Jul. 31, 1984 to Owen et al.) The "Ghost" method uses two separate exposure "passes", one exposing the pattern with a focused beam and the second exposing the complementary pattern with defocused beam of a size similar to the scattering range. No significant real time computation is necessary. However "Ghost" doubles the exposure time. In addition, it has been shown to reduce the contrast of the exposure, which adversely effects process latitude and feature size control. Finally, "Ghost" cannot correct short range scattering and resolution effects, nor can it correct resist heating. Thus "Ghost" is not an optimum proximity correction method.

Therefore it would be desirable to have a method of calculating all electron scattering proximity effects corrections during run-time. It would also be desirable for such a method to calculate proximity effect corrections for resist heating and substrate expansion as well as electron scattering.

SUMMARY

The present invention is directed to a pattern generation system, employing a raster scan writing strategy, capable of making corrections for proximity effects to the pattern during exposure run-time, and the method thereof. While the described embodiments are directed towards an electron beam system, the invention is applicable to other charged particle beam systems as well.

The present invention is directed to converting a vectorized pattern representation to a rasterized pattern representation and providing an apparatus for temporarily storing the representation as pixelized exposure level data. The data is then retrieved from the storage apparatus and the proximity effect corrections are made.

For correction of long range scattering and heating effects, the pixelized exposure level data is used to calculate a coarse coverage map divided into discrete cells. The average exposed area, or pattern coverage, for each cell is calculated and then convolved with pre-calculated convolution kernels to determine long range scattering and heating effect dose multipliers. In addition, the coarse coverage map is advantageously utilized to calculate a global thermal expansion map. The global thermal expansion map contains dose exposure and location histories which allow corrections to be made to dose exposure and location data by calculating changes in size and shape due to heating. In this manner a correction of a proximity effect due to thermal expansion is calculated.

Short range proximity effect correction is performed by first identifying the pattern context of each pixel by evaluating exposure dose data the nearest neighbor pixels. The pattern context identified is then found in a lookup table and a short range dose multiplier retrieved for each pixel. These dose multipliers are pre-calculated dose modifications for pixels that are at pre-determined pattern edges and are calculated by convolving the pattern coverage with scattering and heating convolution kernels. The long range dose multipliers and short range dose multipliers are combined using a pre-calculated exposure lookup table to form dose modulation data for each pixel.

For each type of correction made, an apparatus is provided for both performing calculations and providing temporary storage of correction results. Each temporary storage apparatus stores a portion of the entire pattern as well as data paths for both insertion and retrieval of the corrections, and/or intermediate results.

A exposure dose modulator apparatus is provided that can retrieve and combine long and short range dose modulation data to determine a corrected dose for each pixel of the pattern just prior to exposure of the pixel. A global thermal expansion map is provided and used to determine a correction for each pixel's location. Corrected exposure dose and location data for each pixel is then provided to an exposure apparatus which provides for directing exposure of each pixel at the correct location with the correct exposure dose.

DETAILED DESCRIPTION

Embodiments of the present invention will be described with reference to methods and structures illustrated in FIGS. 1 through 8. These illustrations are simplified representations provided for ease of understanding and description only. Various modifications of the embodiments of the present invention may become apparent to those skilled in the art as they are described. For example, while a representation of rasterized pixel data is described using one of 64 levels to describe a pixel exposure, a person of ordinary skill in the art will understand that alternative representations using other appropriate numbers of levels could be made. Similarly, alternative electronic configurations that execute similar steps in the correction process may be envisioned. All such modifications, variations or adaptations that rely upon the teachings of the present invention, and through which these teachings have advanced the art, are considered to be within the spirit and scope of the present invention.

Figure 1:
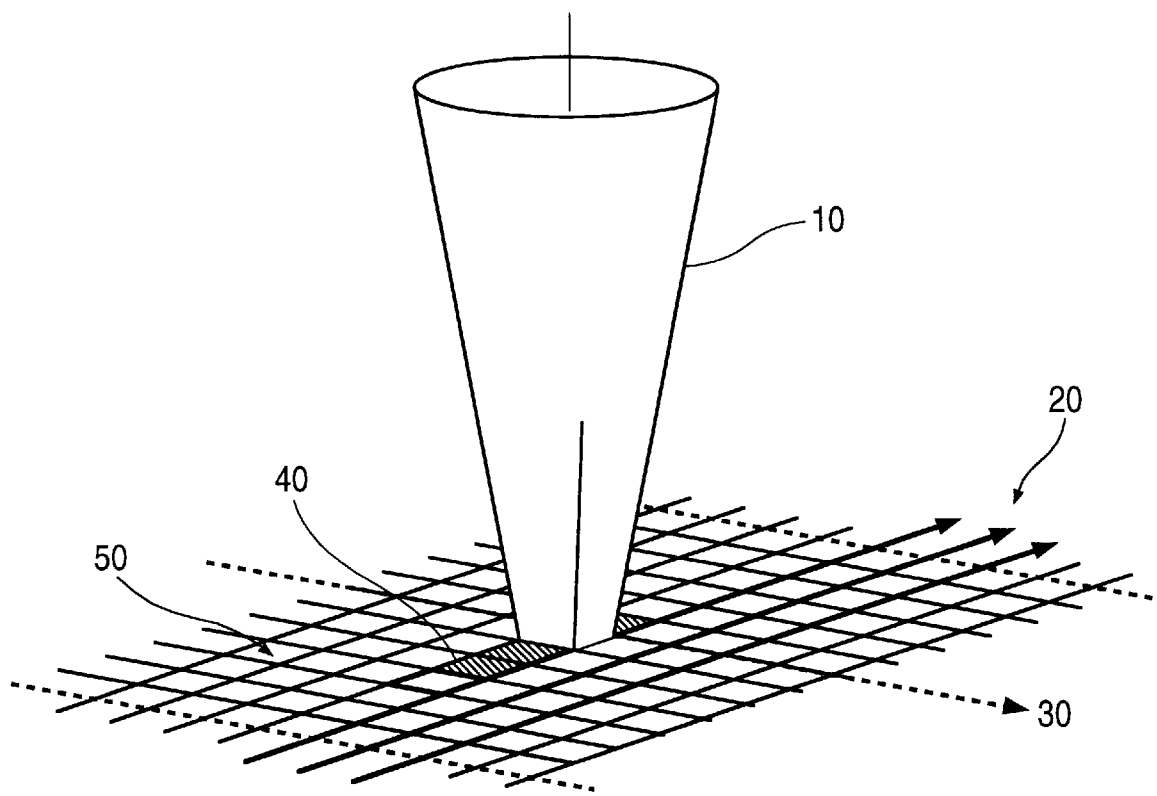
FIG. 1 is a simplified representation of a raster scan writing strategy using a periodic raster scan and stage motion to position a beam on a regular pixel grid.

The run-time proximity corrections disclosed herein employ a raster scan writing strategy and a rasterized pattern data representation in an electron beam pattern generating system. FIG. 1 is a simplified representation of a raster scan writing strategy. One or more round or otherwise shaped electron beams 10 are scanned periodically 20 in a first direction while stage motion 30, in a second, orthogonal direction provides for exposure of each pixel 40. Each time beam 10 is scanned 20 in the first direction exposing one or more rows of pixels 40. To support this writing strategy, data is organized as a regular array of exposure data. Pixels are typically in the range of approximately 0.05 to 0.2 microns ($\mu$m) in diameter to write features having a size in the range of approximately 0.2 to 2.0 $\mu$m. Exposure data for each pixel 40 consists of one exposure level $P_{ij}$ where i and j are indices for grid 50. Where electron beam 10 is on or off, $P_{ij}$=1 or 0 respectively. More complex systems might use 64 exposure levels $P_{ij}$=0 to 63.

The proximity effects discussed herein, fall into one of three broad categories; long range effects, short range effects and global thermal expansion effects. Corrections of these various proximity effects all require calculations to determine what dose modification, if any, will be applied to each pixel during writing. Some calculations involve convolving various functions with one another to result in run-time corrections in the manner herein described. Some calculations use pre-calculated look-up tables and convolution kernels to generate corrections. In addition, some calculations use data initially calculated to generate other corrections. Thus, global thermal expansion is estimated from pattern coverage data calculated for long range proximity effects.

Figure 2:
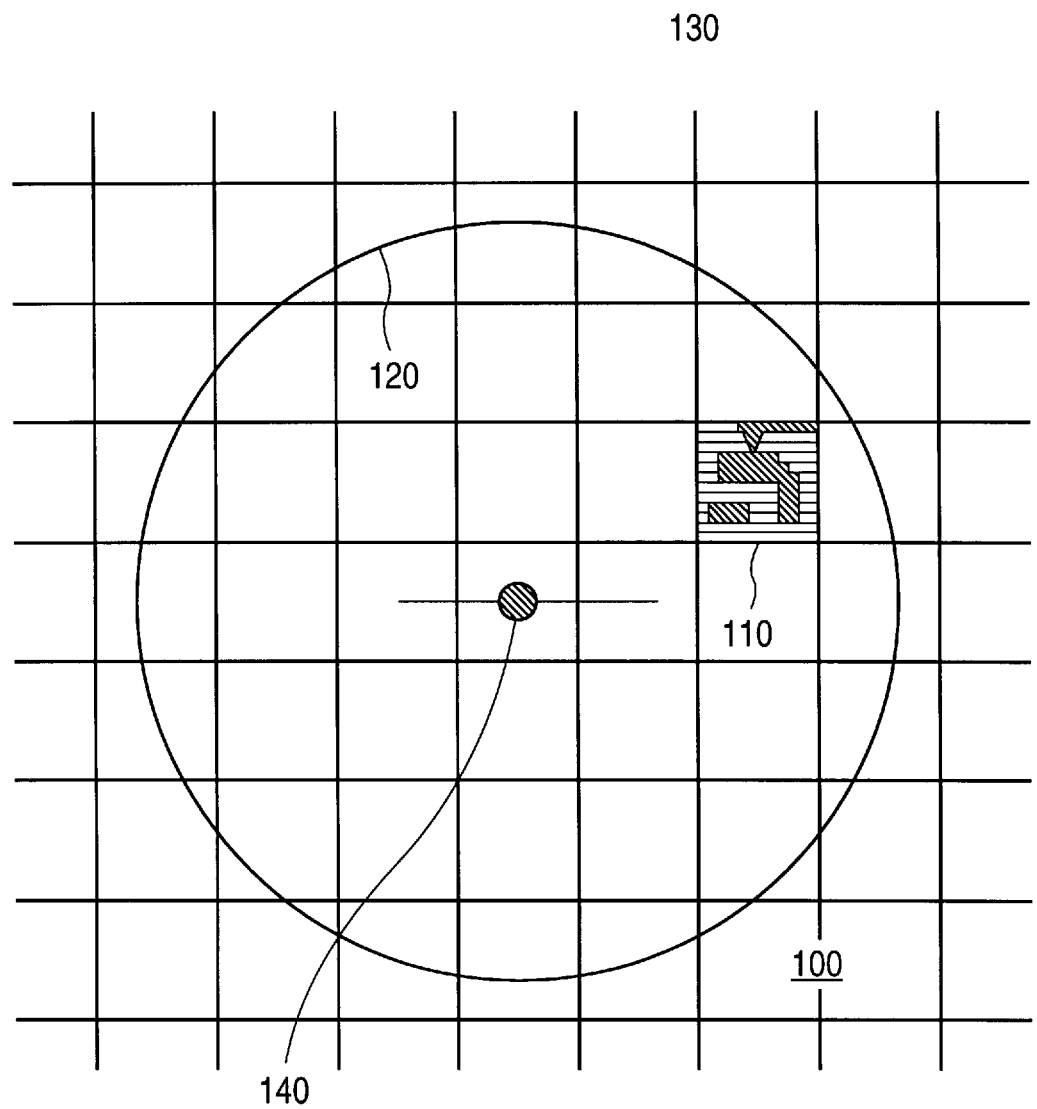
FIG. 2 is a simplified representation of a coarse coverage map derived from rasterized pattern data in an embodiment of the present invention.

Referring now to FIG. 2 a field of pattern data 120 in raster format is shown. To determine long range heating and scattering corrections, a convolution calculation at each site in field 120 is required. Such a convolution calculation sums exposure dose contributions from all nearby sites and can be expressed, in general, as:

$$(P*f) \text{ at } x,y = \iint P(x-x', y-y')f(x', y')dx', dy' \quad (1)$$

where $P(x,y)$ is a mathematical function describing the amplitude of a pattern exposure at site $(x,y)$ and $f(x',y')$ is a point spread or blurring mathematical function that describes the relative influence of a unit exposure at site $(x',y')$ as a percentage of the total influence from all nearby sites.

When the functions are represented in rasterized format on a grid 110 having discrete sites with indices i,j as seen in FIG. 2, convolution $C=(P*f)$, at grid site k,l may be expressed as:

$$C_{k,l}=(P*f)_{k,l}=\Sigma_{ij}P_{ij}f_{k-i,l-j} \quad (2)$$

where the spread function f is normalized and where C can apply to scattering or heating depending on the kernel f used in the convolution. The spread function has significant value only within radius 120, therefore the convolution of Equation 2 only has to be evaluated over the field shown.

Repetitive calculation of Equation 2 for each pixel site generates a modified map that accounts for proximity effects. When the size of individual pixels is small compared to the range of the proximity effect interactions, the number of calculations required for each pixel is too large for run time correction. For example, a 50 kV electron beam having a calculation field of 50$\mu$ per side and a beam diameter of 0.05 $\mu$m, has 1,000,000 pixels within field 100. Therefore 1,000,000 computations for each pixel would be required. This is too many where, as in raster scan lithography, the pixel exposure rate can exceed 100 MHz.

However, if rather than using a pixel as the basic unit, the pattern is represented on a coarse coverage grid having cells 130 that are larger than a pixel but still smaller than the scattering range for a specified beam acceleration voltage, the computation is simplified. Rather than an N×N pixel data field, an M×M cell unit data field indexed k,l, is created, where each unit contains $(N/M)^2$ individual pixels. This simplification places the value of the slowly varying point spread function $f_{k,l}$ in the middle of each unit. Where the spread function for each pixel in a cell is reasonably represented by this value the calculation rate is greatly enhanced.

For the cell 140 in the center of FIG. 2, the value of the convolution in EQ. 2 becomes:

$$C_{0,0}=(P*f)\approx\Sigma_{cell\ field\pm k,\pm l}f_{k,l}\{[1/4i_0j_0]\Sigma_{\pm i_0,\pm j_0 cell\ k,l}P_{i,j}\} \quad (2.1)$$

While one add operation per pixel cycle is still required to find the local coverage $P_{k,l}=1/4i_0j_0\Sigma P_{i,j}$ for each cell, on the coarse grid the number of multiply and add operations for the convolution is reduced. Rather than $N^2$ operations, only $M^2$ operations are needed to find $C_{k,l}$ for one cell. Thus, for a typical 100 MHz pixel exposure rate, the rate of individual operations in an M×M convolver is under 10 MHz making real time computation of long range proximity effects possible.

Once this simplification is applied and a convolution value $C_{k,l}$ for each cell is calculated, a specific algorithm for dose modulation of all pixels with a cell is applied to calculate a correction map. While the specific algorithm employed can vary, the algorithm selected is essentially a design choice, tailored to result in an exposure dose function where the effective energy deposited at the edges of all features equals an optimum threshold energy for resist development. This optimum threshold, $E_{eff}=1/2$, is positioned where the gradient of deposited energy is steepest and edges are least likely to shift due to dose errors.

One example of a possible algorithm that combines both long range scattering and heating effects is:

$$d_{\beta\gamma} \approx \frac{(1+\eta)}{[l+2\eta(P*\beta)][1+\mu(P*\gamma)]} \quad (3)$$

$\eta$ is the ratio of total energy deposited in the resist from backscattered electrons passing upward to the energy deposited by downward moving electrons.

$\mu$ is a constant reflecting the additional effective dose deposited when all surrounding previously exposed flash sites are exposed generating a heating effect, as compared to the same exposure without a heating effect.

$\gamma$ is a normalized spread function reflecting indirect heating effects from the substrate below the resist.

$\beta$ is a normalized spread function reflecting energy deposited in the resist by electrons passing upward after backscattering from the substrate below the resist.

Convolution kernels $\gamma_{k,l}$ and $\beta_{k,l}$ are pre-calculated while convolutions values $(P*\gamma)_{k,l}$ and $(P*\beta)_{k,l}$ for each site k,l are calculated from the pattern data in run time. Since there is a unique dose multiplier $d_{\beta\gamma}$ for each combination of heating and scattering coverage ($P*\beta$) and ($P*\gamma$), this data can be used as lookup address data to find the correction dose multiplier $d_{\gamma\beta}$ for all flashes in cell k,l. The convolution of the pattern with the kernel is the only pattern dependent calculation that must actually be done in run time.

Figure 3:
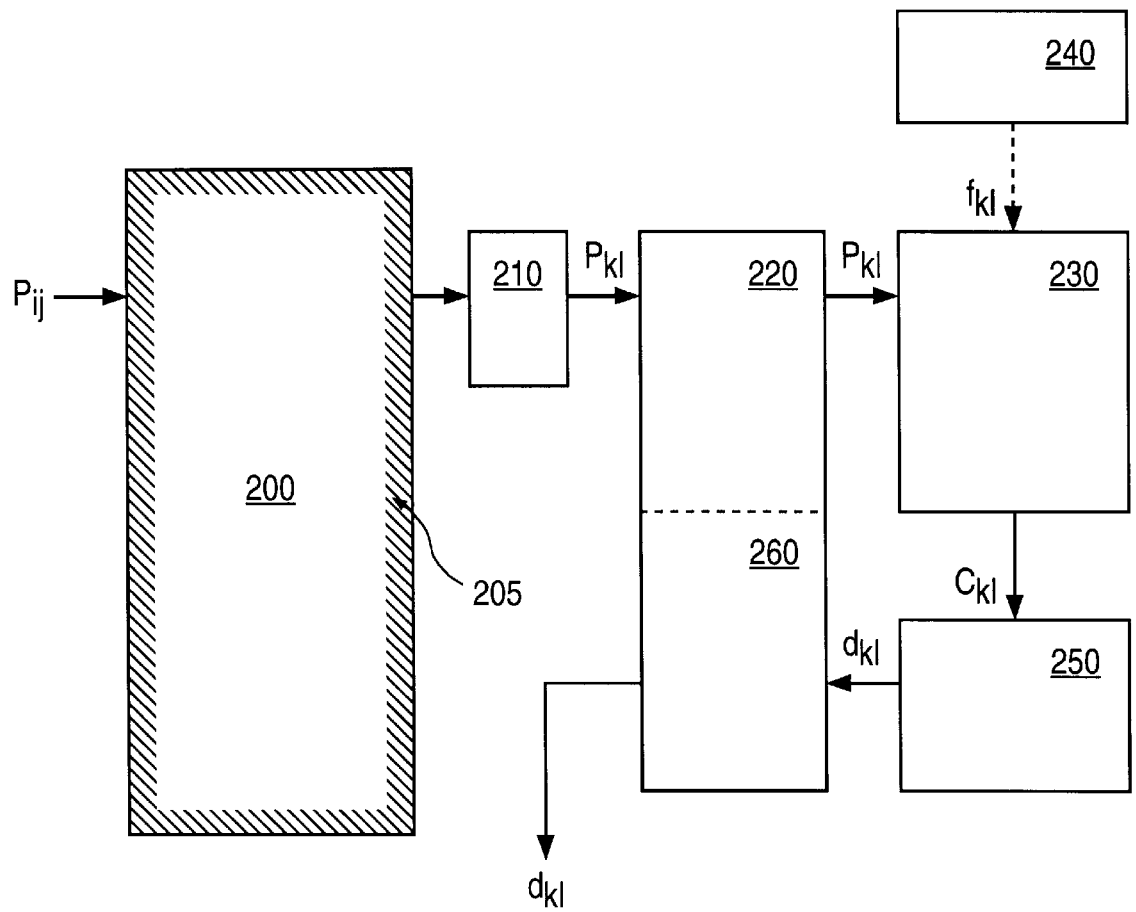
FIG. 3 is a block diagram illustrating steps required to create an intermediate proximity effect correction output, for run time correction of long range scattering and heating proximity effects from a rasterized data base, employed in an embodiment of the present invention.

Turning now to FIG. 3, a block diagram illustrating the run-time correction of long range scattering and heating proximity effects of an embodiment of the present invention is shown. Once created, rasterized pixel data is stored, for example, in a pattern buffer memory device 200 and is supplied to a cumulative summing device 210. Summing device 210 performs $\Sigma P_{ij}$ of all pixels within each cell k,l to generate coarse coverage map $P_{kl}$. Coarse coverage map $P_{kl}$ is stored in a map buffer memory device 220. When map buffer device 220 is full, map $P_{kl}$ data is provided to a multiplier/cumulative adder device or convolver 230 and a convolution $C_{kl}=(P_{kl}*f_{kl})$ for each cell is calculated using pre-calculated convolution kernel data $f_{kl}$ supplied from a kernel buffer memory device 240 to convolver 230. Thus a convolution sum $\Sigma P_{kl}f_{kl}$ is calculated once for each cell. Each value of $\Sigma P_{kl}f_{kl}$ is used as an address for a lookup table device 250 which holds correction values $d_{kl}$ corresponding to coverage $C_{kl}$. Finally, the values selected for dose modification, $d_{kl}$, are stored in an exposure dose modulation buffer memory device 260. As simultaneous calculation of long range scattering and heating corrections require different convolution calculations, there are separate kernel memory devices 240 and convolvers 230 for each where required.

Convolutions of pixels near an edge of a coarse map region require data from adjacent regions. Therefore, pattern buffer memory device 200 contains data for a segment of one scan stripe and fringe regions 205 surrounding that segment. These fringe areas 205 have a width approximately equal to the heating and scattering range. For typical beam voltages this fringe is about 10 to 40$\mu$ wide. Since scan field 20 in FIG. 1 is typically 10× wider, the additional requirements of this fringe data do not significantly reduce throughput. Thus a coarse coverage map derived from a raster scan pattern generator data format provides for speed enhanced convolution calculations. In addition, a convolver configuration has been shown that allows for dose modification within coarse map cells, where a lookup table is used to execute the correction algorithm from such coarse map data. Where simultaneous long range heating and scattering corrections are required, analogous convolvers and storage devices are provided. As one having skill in the art knows, each of the devices described above with respect to FIG. 3 and the devices that will be described with respect to FIGS. 5 and 6 below, can be implemented techniques. For example, convolver 230 can be a general purpose microprocessor running software designed to make the aforementioned convolutions or convolver 230 can be a convolution engine implemented using one or more semiconductor devices.

Figure 4A:
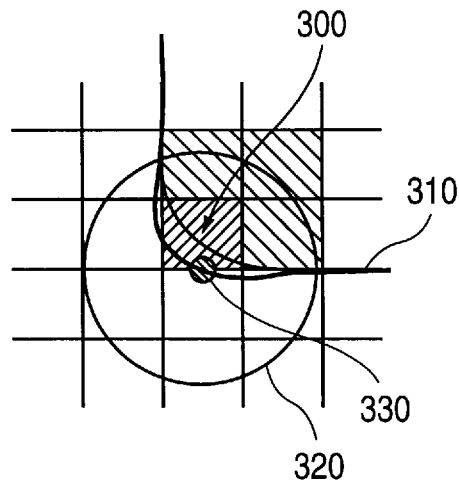
FIGS. 4a and 4b are simplified illustration of the use of nearest neighbor pixel exposure data from a rasterized data base to recognize pattern features such as edges and corners in an embodiment of the present invention.
Figure 4B:
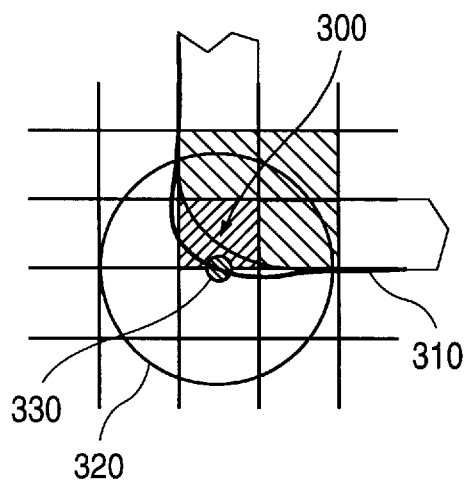

Turning to correction of short range proximity effects due to limited image resolution, forward scattering and local heating from adjacent pixel sites, FIGS. 4a and 4b show 3×3 arrays of nearest neighbor pixels surrounding a central pixel 300. If all eight nearest neighbor pixels are fully exposed, e.g. $P_{ij}=1$, then pixel 300 is an interior pixel of a feature. If any nearest neighbor pixels are unexposed, e.g. $P_{ij}=0$, then pixel 300 is at either at an edge or a corner of a feature. In both FIGS. 4a and 4b, center pixel 300 unambiguously represents an approximately right angle outside corner.

Short range proximity effects will round this corner as indicated by line 310 in each of FIGS. 4a and 4b. However, dose corrections can assure that the effective exposure dose is the same at any point along line 310. To make the necessary dose corrections, the values of $(P*\kappa)_e$ and $(P*\sigma)_e$, at the edge and corner pixels need to be determined and applied to calculate the dose modulator for each edge pixel. Thus the convolution edge coverage function $(P*\kappa)_e$, using the normalized spread function $\kappa(x',y')$ for electrons moving downward through the resist, and the local edge coverage function $(P*\sigma)_e$, using the normalized spread function $\theta(x', y')$ due to direct heating, are used to determine the edge exposure dose correction.

Thus, short range edge dose correction consists of three steps. First is pre-calculation of the convolutions and edge modulation dose corrections. These calculations are performed beforehand for each possible pattern context in the 3×3 array of nearest neighbors. Second is recognition of a specific pattern from rasterized data and third is implementation of the correction by assigning dose modifications to each edge pixel. Only the last two steps must occur in run-time.

While short range proximity effect corrections might also be calculated using convolver circuits, lookup table techniques using near neighbor pixel data are more efficient. Viewed within a field of a few pixels, there are a very limited number of possible patterns such as edges and corners. These can be easily recognized and corrected by finding the appropriate multiplier in a lookup table.

In FIGS. 4a and 4b, a circle 320 indicates the range over which interactions, reflected by $\kappa$ or $\sigma$, act. If the correction works properly, the edge of the developed pattern should pass through the sampling point 330. FIG. 4a shows a corner of a larger feature at which $(P*\kappa)_e$ and $(P*\kappa*\sigma)_e$ are calculated. FIG. 4b shows a slightly different pattern representing the corner of a one pixel wide line. In FIG. 4b, the local coverage is somewhat smaller because less pattern area contributes to the exposure dose along line 310. Thus a dose modulation for the structure in FIG. 4a would differ from that of FIG. 4b.

Figure 5:
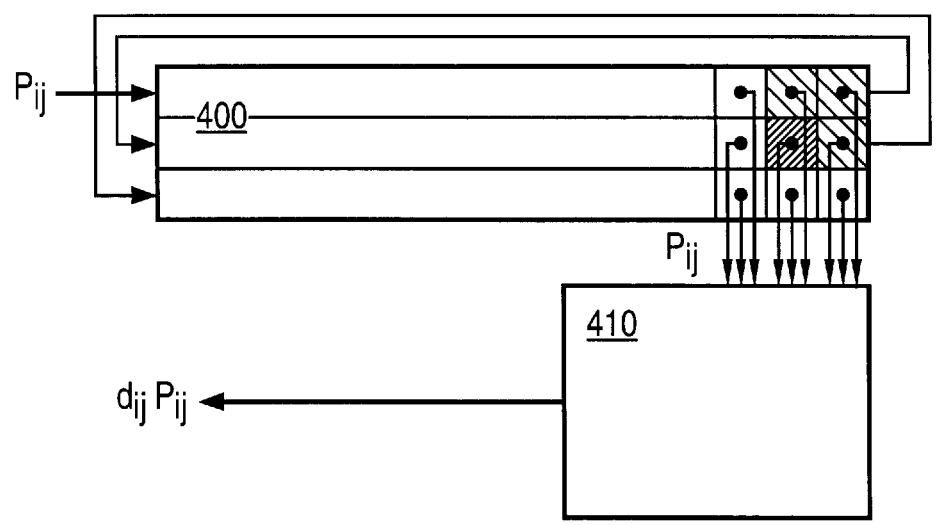
FIG. 5 is a block diagram illustrating steps required to create an intermediate proximity effect correction output for correction of short range proximity effects from a rasterized data base employed in an embodiment of the present invention.

FIG. 5 shows an embodiment of the present invention useful for nearest neighbor processing using pre-calculated short range corrections. Pattern data $P_{ij}$ from the buffer 200 (FIG. 3) is passed through a shift register (400) scan line by scan line. In this manner, data for all nine nearest neighbor pixels are made available simultaneously, avoiding the necessity of repetitively fetching all eight neighbors from pattern memory each time a pixel is processed. Pattern data $P_{ij}$ from all nine nearest neighbor pixels is used as address for a lookup table memory 410 containing the appropriate edge dose correction $d_{ij}P_{ij}$ for each possible pattern. Where all nine pixels are equally dosed, a pixel is automatically recognized as an interior pixel and no correction is assigned.

Correction of both short range scattering and short range thermal effects can be combined in the same lookup table by simply including both effects in the pre-calculated dose corrections. However, as each rotational orientation of a corner or edge is composed in a different sequence of pixel exposures, more memory is required to account for nearest neighbor heating.

As one having ordinary skill in the art will know, configurations other than that of FIG. 5 can execute dose modulation corrections $d_{ij}$. In addition, the nearest neighbor field does not have to be limited to eight nearest pixels. More pixels can be selected. However, whatever configuration is selected, pre-calculated edge dose corrections identified by a pattern recognition algorithm or device provides a method for run time correction of short range proximity effects in electron beam lithography.

Figure 6:
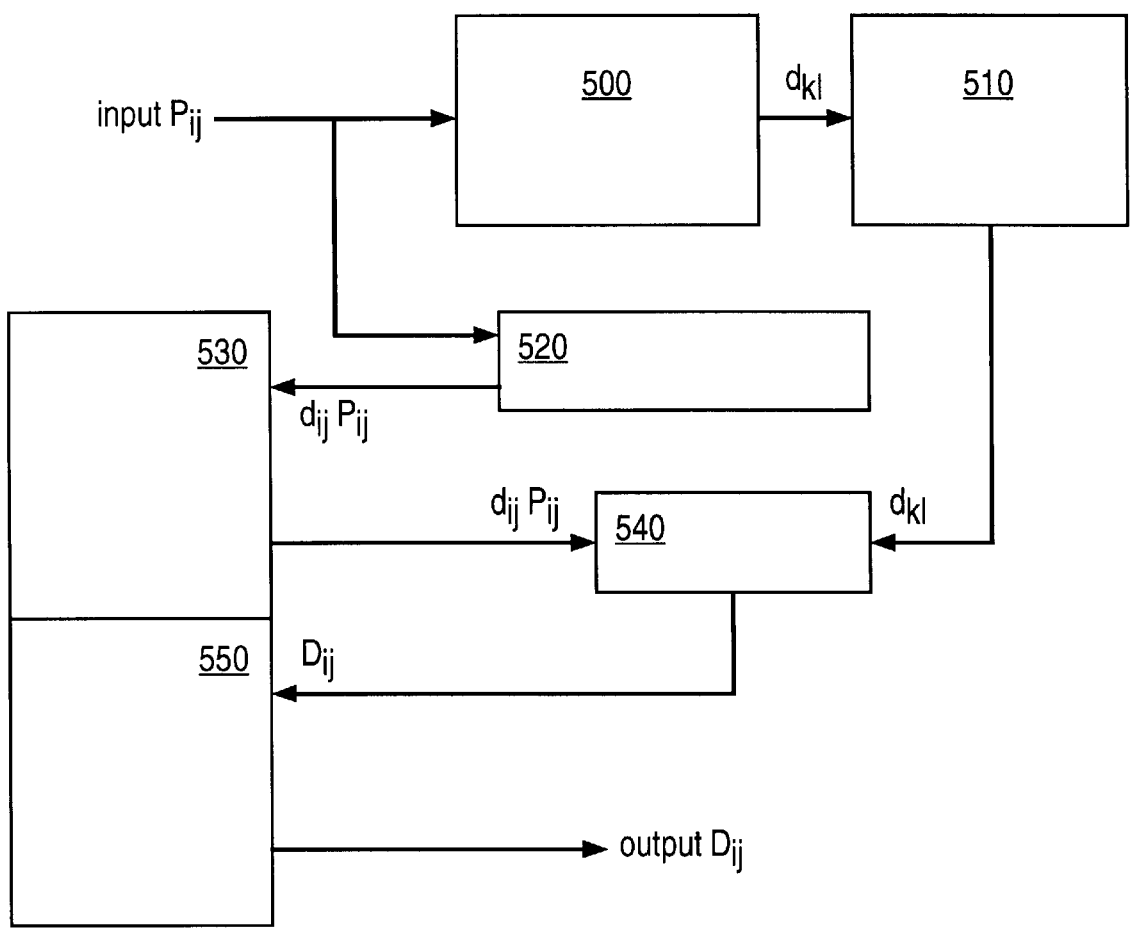
FIG. 6 is a block diagram illustrating steps required to create an intermediate proximity effect correction output to correct for both long and short range proximity effects from a rasterized data base employed in an embodiment of the present invention.

Referring now to FIG. 6, a block diagram illustrating an embodiment of the present invention that creates an intermediate proximity effect correction output for both long and short range proximity effects from a rasterized data base is shown. Data $P_{ij}$ from a pattern buffer memory 200 (FIG. 3) is processed for scattering and for heating by one or more long range correction processors 500, creating long range correction convolutions $C_{kl}$. Correction processors 500 are functionally similar to that shown and described with respect to FIG. 3. Output from processors 500 is stored in a temporary correction buffer 510 to provide for proper timing. Pixel data $P_{ij}$ is also processed by a nearest neighbor processor 520 functionally similar to that shown in FIG. 5.

Output from processor 520, $d_{ij}P_{ij}$, is stored in a pixel data buffer 530. When both the cell correction buffer 510 and pixel data buffer 530 are loaded with corrected data, a lookup table 540 executes the correction algorithm using data from buffers 510, 530 as address data to find dose function $D_{ij}(C_{kl},d_{ij},P_{ij})$. Long range coverage data $C_{kl}$ from buffer 510 is used for all pixels in each cell k,l, while short range coverage data $d_{eij}P_{ij}$ from buffer 530 changes for each pixel according to the pattern context. As the number of coverage percentage levels and near neighbor combinations are limited, the memory requirement is not large.

The result of the correction algorithm, $D_{ij}$, is stored in a corrected pattern data buffer 550 until it is needed for exposure by the system. As no pattern buffer memory is read or written more than once per pixel cycle, data processing can be synchronous and at the same rate as the basic pixel rate.

As is known, reticles used in light optical steppers often include optical proximity (OPC) corrections. OPC corrections are intentional modifications of the desired pattern used to improve a light optical image generated from that reticle when the reticle is used in a light optical stepper. Typically, pre-processing routines are used to modify an original pattern and apply OPC corrections when making a reticle for use in a light optical stepper. Thus standard corrections to features such as corners and ends of narrow lines and intentional biasing of edge locations and feature sizes to compensate for process effects are typically performed in a pre-electron beam exposure operation.

In some embodiments of the present invention, the nearest neighbor processor 400 (FIG. 5) can not only recognize edges and corners, but can also shift them in prescribed ways, generating biasing and OPC corrections automatically within the system. This can be done by moving the sampling points for calculation of the near field coverage functions, or by using nearest neighbor data to modify pattern context in pre-specified ways before dose modulation corrections are applied. Corrections of the first type can be pre-programmed in the short range correction lookup table, creating the same modification at every similar site in the pattern.

Figure 7:
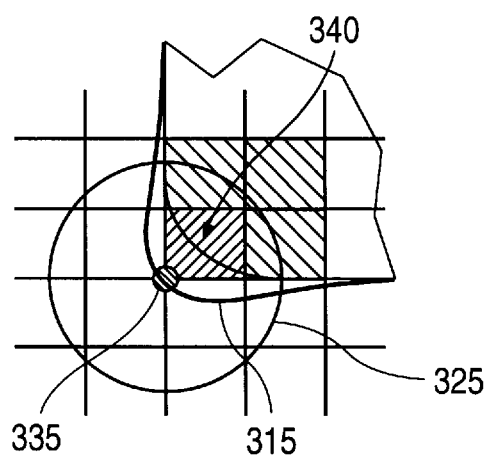
FIG. 7 is an illustration of an example of a pre-programmed modification of pattern data from a rasterized data base using nearest neighbor lookup table methods in an embodiment of the present invention.

FIG. 7 shows how the evaluation of local pattern coverage can be modified to induce intentional edge shifts near features such as corners or edges. The corner configuration of FIG. 4a is shown again, however sampling point 330 of FIG. 4 has been shifted outwards to become sampling point 335 located at the corner of the pattern. Comparing circle 320 of FIG. 4a with circle 325 of FIG. 7, less pattern area is seen to be within circle 325. Thus the local coverage values $(P^*\kappa)_e$ will be correspondingly smaller resulting in a larger exposure dose for corner pixel 340. The expected resist development contour is indicated by line 315. Note that while statistics still limit the radius of the corner, open area near corner pixel 340 has increased.

Figure 8:
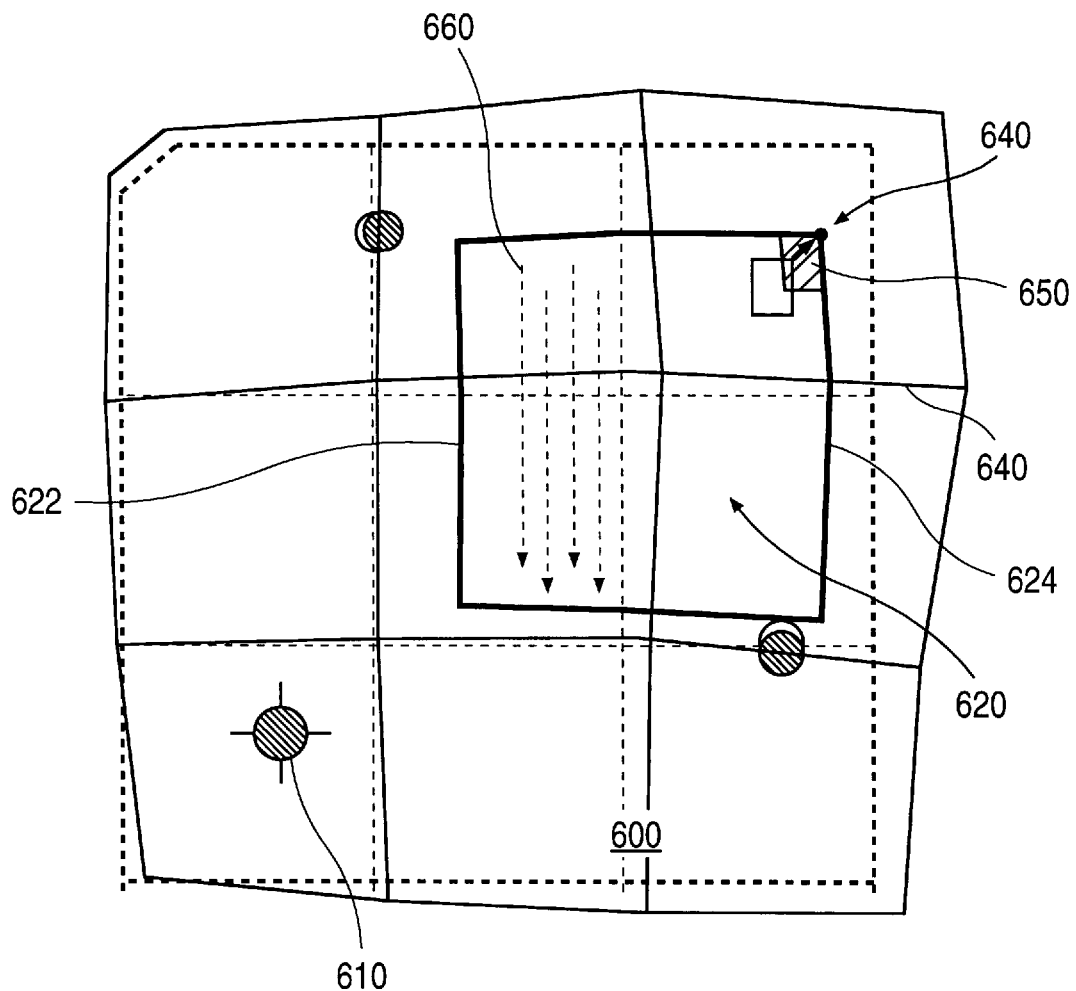
FIG. 8 is a simplified illustration of global thermal expansion effects and correction using pattern coverage data in an embodiment of the present invention.

Turning to predictive correction of global thermal expansion that would otherwise cause feature position errors, FIG. 8 illustrates a substrate 600 mounted upon a three point suspension (not shown) in such a way that it can expand or rotate elastically about a fixed point 610. Substrate's 600 original shape and pattern grid is represented by dotted lines. As is known, exposure of region 620 by an electron beam (not shown) results in heat absorption within region 620 and a temperature distribution across substrate 600. This heat absorption results in a change in shape and location of region 620 with respect to fixed point 610. Thus, as region 620 is exposed, a feature origin 640 shifts with respect to fixed point 610. This shift is referred to as a global thermal expansion effect and is a third type of proximity effect.

Calculation of global thermal expansion effect corrections uses data from coarse coverage map $P_{kl}$. Since global thermal expansion is a very slow acting, long range effect, a coarse finite element grid can be used. The origin and total pattern coverage within a scan stripe segment, for example an approximately $500\mu$ square pattern area, is adequate input data. Heat deposited into a scan stripe segment is proportional to the cumulative sum of corrected doses. The origin address of the stripe segment is used as the location at which the heat is deposited. Using pattern coverage data $P_{kl}$ to provide heat input information as well as coverage data for proximity correction, a global thermal expansion map can be calculated to provide corrections and calculate a feature origin shift during run-time using a finite element analysis.

Any of a number of existing finite element analysis programs for calculating thermal expansion behavior can be used. The locations and amount of heat energy added at each location can be updated periodically, for example once per minute, and updated prediction of the segment origin locations provided. This updated prediction of stripe segment shift is added to the beam or stage offset 650 before additional segments are exposed.

Distortion of region 620 during exposure is influenced not only by the total heat deposited during exposure, but also by where that heat is deposited. For example, if a pattern is exposed progressively, moving from a first side 622 to a second side 624, in one scan stripe increments, distortion is seen to be trapezoidal. In some embodiments of the present invention, an interlaced trajectory 660 is used to more uniformly heat region 620. Such uniform heating limits shape distortion and essentially reduces global expansion and simplifies calculation of corrections.

Thus a new method for providing run-time correction of proximity effects in electron beam lithography has been disclosed. The method provides for the correction of both long range and short range effects due to heating and scattering. In addition, the method provides for correction of global thermal effects.

The embodiments of the present invention offer substantial advantages over prior art methods of proximity effect correction. Using a rasterized pattern data base, all corrections can be performed during run-time, realizing significant time savings by eliminating preprocessing of pattern data. In addition, embodiments of the present invention also provide additional proximity effect corrections than previous methods have provided by performing the correction calculations during run time and using intermediate results to calculate more than one correction. Finally, embodiments of the present invention have been provided that apply OPC corrections during run-time. In this manner, an original pattern data base can be maintained and OPC corrections altered for each reticle to tailor the reticles for differing process capabilities.

What is claimed is:

1. A method of forming a pattern using a pattern generation lithography system having a beam, comprising converting a first data base having a vectorized representation of said pattern into a second data base having a rasterized representation of said pattern as pixels, wherein each pixel of said rasterized representation has a first exposure dose, and one or more steps selected from the group consisting of:

calculating short range proximity effect dose (SRPED) correction multipliers from said rasterized data base wherein said (SRPED) correction multipliers result from beam scattering and/or heating;

calculating long range proximity effect dose (LRPED) correction multipliers from said rasterized database wherein said (LRPED) correction multipliers result from beam scattering and/or heating, and creating global thermal expansion proximity effect correction factors from said rasterized data base wherein said correction factors result from beam heating; and exposing said pattern with said beam wherein said beam is corrected for the selected proximity effects, while said pattern is being exposed by said beam.

2. The method of claim 1 wherein exposing said pattern further comprises calculating beam position corrections for each pixel of said second data base during run-time and using said position corrections to affect a position of said beam.

3. The method of claim 1 wherein calculating short range proximity effect dose correction multipliers comprises identifying a pattern context for each pixel of said second data base using exposure dose data from near neighbor pixels.

4. The method of claim 3 wherein calculating short range proximity effect dose correction multipliers comprises using said pattern context to apply a pre-calculated edge correction factor to exposure dose data for each pixel.

5. The method of claim 1 wherein creating long range proximity effect dose correction multipliers comprises defining a plurality of cells using said rasterized data base, wherein each cell has a dimension larger than one pixel and smaller than the scattering range for a specified voltage for accelerating said beam.

6. The method of claim 5 wherein a coarse coverage map is created by forming a cumulative sum of each pixel exposure dose within each said cell of said plurality of cells.

7. The method of claim 5 wherein creating long range proximity effect dose correction multipliers comprises creating a coarse correction map by calculating a convolution value for each cell of said plurality of cells.

8. The method of claim 7 wherein creating long range proximity effect dose correction multipliers comprises convolving values from said coarse coverage map with pre-calculated convolution kernels.

9. The method of claim 1 wherein creating a global thermal expansion proximity effect correction factor comprises calculating a feature origin shift.

10. The method of claim 1 wherein exposing said pattern comprises calculating a second exposure dose using long range proximity effect dose correction multipliers and short range proximity effect dose correction multipliers.

11. The method of claim 1 wherein exposing said pattern comprises calculating a second exposure dose using long range proximity effect dose correction multipliers and a feature origin shift using global thermal expansion proximity effect correction factors.

12. A method of forming a pattern using a beam corrected for proximity effects comprising the steps of:

converting a vectorized data base of a pattern to a rasterized data base of said pattern comprising a plurality of pixels, wherein each pixel is represented as a specified exposure dose of said beam;

defining a plurality of cells from said rasterized data base wherein each cell has a dimension larger than one pixel and smaller than a predetermined scattering range of said beam;

creating a coarse coverage map wherein said coarse coverage map comprises a convolution value for each cell of said plurality of cells;

creating a global thermal expansion map for said pattern wherein said global thermal expansion map is calculated using said convolution values;

creating first dose correction multipliers for each cell by convolving values from said coarse coverage map with pre-calculated convolution kernels;

identifying a pattern context for each pixel of said rasterized data base using said specified exposure dose of each near neighbor pixel;

creating second dose correction multipliers for each pixel by applying pre-calculated edge correction factors in accordance with said pattern context;

calculating dose modulations by combining said first and second dose correction multipliers using a lookup table;

calculating a corrected exposure dose for each pixel using said dose modulation;

calculating a feature origin shift for each pixel using said global thermal expansion map; and exposing said pattern on a resist coated substrate using said beam, wherein each pixel of said pattern is exposed using said corrected exposure dose and said feature origin shift.

13. The method of claim 12 wherein the steps of forming a coarse coverage map, creating a global thermal correction map, identifying a pattern context for each pixel, creating first and second dose correction multipliers, and calculating exposure dose modulations are performed while exposing said pattern with said beam.

14. The method of claim 12 wherein said step of creating first dose correction multipliers comprises using a pre-calculated convolution kernel describing electron scattering of said beam.

15. The method of claim 14 wherein said step of creating first dose correction multipliers further comprises using a pre-calculated convolution kernel describing heating of said resist by said beam.

16. The method of claim 12 wherein said step of creating first dose correction multipliers comprises using a pre-calculated convolution kernel describing both heating and scattering proximity effects.

17. The method of claim 12 wherein the step of creating a global thermal expansion map comprises calculating thermally induced changes of said substrate based upon average electron beam current and an electron beam location history generated while exposing said pattern.

18. The method of claim 12 wherein exposing a pattern on a substrate comprises scanning said beam across said substrate using an interlaced periodic scan pattern.

19. The method of claim 12 wherein exposing a pattern on a substrate comprises modifying a position of said beam based upon said global thermal expansion map.

20. A pattern generating system comprising:

a source of a charged particle beam;

an apparatus for periodically scanning said charged particle beam over a surface;

a pattern conversion apparatus for converting a pattern data base from a vectorized representation to a rasterized representation;

a first data storage apparatus coupled to said pattern conversion apparatus, wherein a portion of said rasterized representation of said pattern data base is stored as a first plurality of pixel data, each pixel having an exposure dose, for said beam, at a first exposure level;

a proximity effect correction apparatus coupled to said first data storage apparatus, wherein said first exposure level of each pixel stored in said first data storage apparatus is retrieved and modified to correct for proximity effects to form a second plurality of pixel data corresponding to said first plurality of data, each pixel having an exposure dose, for said beam, at a second exposure level;

a second data storage apparatus coupled to said proximity effect correction apparatus, for storing said second plurality of pixel data; and an exposure dose modulator and beam position apparatus coupled to said second data storage apparatus, wherein said second plurality of pixel data is retrieved from said second data storage apparatus and used to control said source of said charged particle beam to expose each pixel on said substrate;

wherein said proximity effect correction apparatus causes pixel data to be input to said first storage apparatus and said second storage apparatus as said exposure dose modulator and beam position apparatus retrieves pixel data from said second storage apparatus, such that pixel data for a portion of said pattern is stored within said first storage apparatus and second storage apparatus until retrieved for exposure of said pattern by said charged particle beam is completed.

* * * * *

UNITED STATES PATENT AND TRADEMARK OFFICE
CERTIFICATE OF CORRECTION

PATENT NO.    : 5,847,959
ISSUE DATE    : December 8, 1998
INVENTOR(S)   : Lee H. Veneklasen et al.

It is certified that error appears in the above-identified patent and that said Letters Patent is hereby corrected as shown below:

Column 7, line 50, delete "at" (second occurrence);

Column 7, line 63, delete "$\theta$" and substitute --$\sigma$--; and

Column 9, line 8, delete "$d_{eij}P_{ij}$" and substitute --$d_{ij}P_{ij}$--..

Signed and Sealed this

Thirtieth Day of March, 1999

Attest:

Q. TODD DICKINSON

Attesting Officer

Acting Commissioner of Patents and Trademarks